(12) United States Patent
Meehl et al.

(10) Patent No.: US 9,702,934 B1
(45) Date of Patent: Jul. 11, 2017

(54) REDUCING MASK DATA VOLUME WITH ELASTIC COMPRESSION

(71) Applicant: Cadence Design Systems, Inc., San Jose, CA (US)

(72) Inventors: Dale Edward Meehl, Melbourne, FL (US); Vivek Chickermane, Slaterville Springs, NY (US)

(73) Assignee: CADENCE DESIGN SYSTEMS, INC., San Jose, CA (US)

( * ) Notice: Subject to any disclaimer, the term of this patent is extended or adjusted under 35 U.S.C. 154(b) by 0 days.

(21) Appl. No.: 14/921,769

(22) Filed: Oct. 23, 2015

(51) Int. Cl.
*G06F 11/22* (2006.01)
*G06F 17/50* (2006.01)
*G01R 31/3183* (2006.01)
*G01R 31/3177* (2006.01)

(52) U.S. Cl.
CPC . *G01R 31/318335* (2013.01); *G01R 31/3177* (2013.01)

(58) Field of Classification Search
CPC .............................................. G01R 31/318335
USPC .......................................................... 716/136
See application file for complete search history.

(56) References Cited

U.S. PATENT DOCUMENTS

| | | | |
|---|---|---|---|
| 8,650,524 B1* | 2/2014 | Chakravadhanula . | G06F 17/505 716/106 |
| 8,904,256 B1* | 12/2014 | Chakravadhanula | G01R 31/318547 714/729 |
| 2002/0124217 A1* | 9/2002 | Hiraide ................... | G06F 11/27 714/726 |
| 2005/0060625 A1* | 3/2005 | Wang ............. | G01R 31/318547 714/727 |
| 2007/0067688 A1* | 3/2007 | Vranken .......... | G01R 31/31719 714/733 |
| 2011/0307750 A1* | 12/2011 | Narayanan ..... | G01R 31/318547 714/729 |
| 2015/0025819 A1* | 1/2015 | Chandra ........ | G01R 31/318547 702/58 |
| 2016/0109514 A1* | 4/2016 | Jindal ............ | G01R 31/318572 714/727 |

* cited by examiner

*Primary Examiner* — Suresh Memula
(74) *Attorney, Agent, or Firm* — Andrews Kurth Kenyon LLP

(57) ABSTRACT

Systems and methods disclosed herein provide for efficiently loading mask data to the mask register bits from the decompression network outputs of an ATPG system. The systems and methods also provide an elastic interface utilized between a tester and a decompressor network (e.g., sequential and combinational decompressors) in order to expand the number of input variables utilized during the loading of the mask data to the mask register bits.

20 Claims, 19 Drawing Sheets

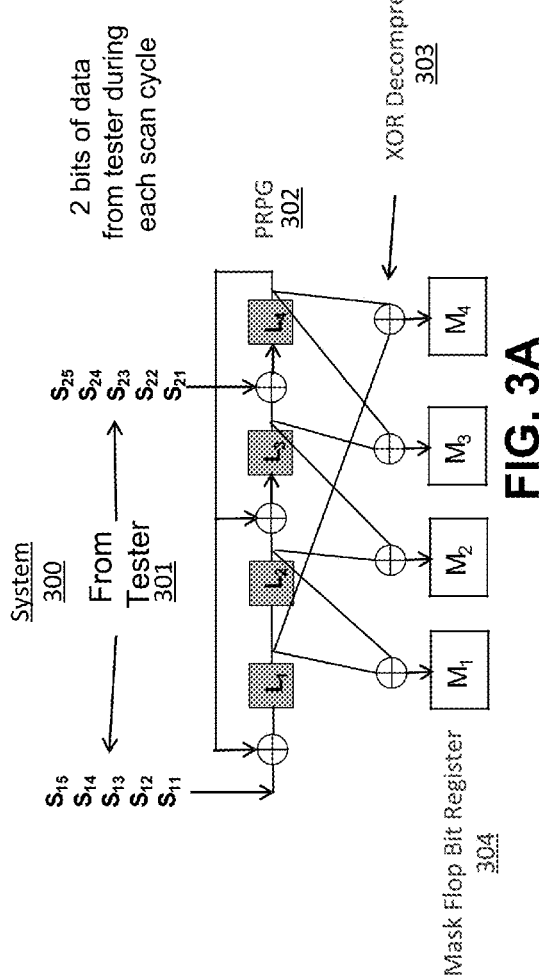

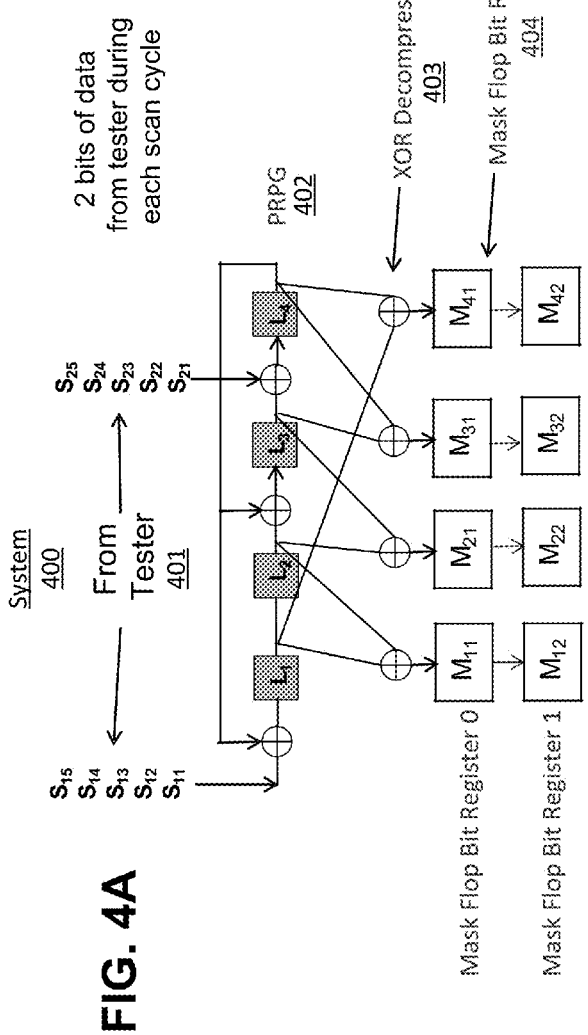

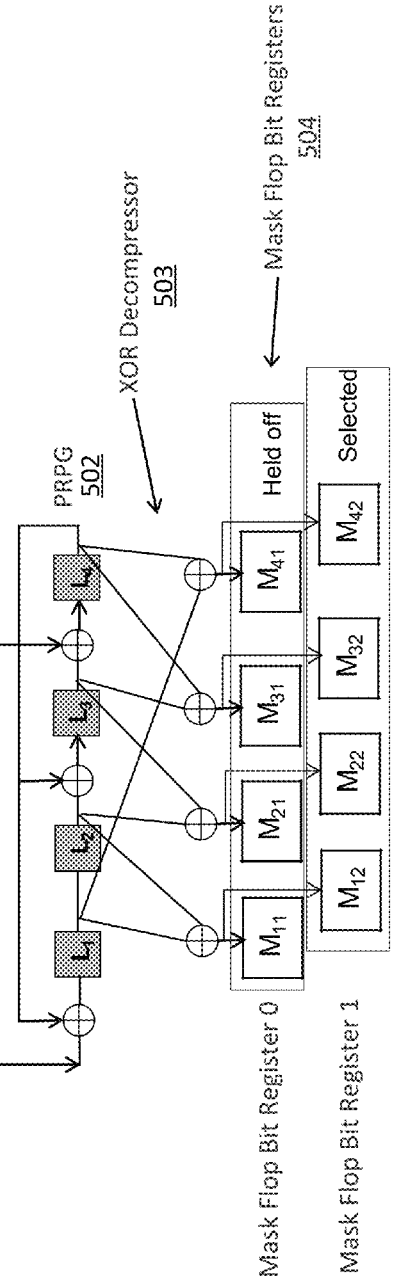

Equations for Masking bits after running for 5 scan clock cycles

| | | | | | |
|---|---|---|---|---|---|
| Mask Bit 0 | L3+S11+L1+S21+S24 +S25+S18+L2+L4+S2 2+S23+S16+S17 | L2+L4+S22+S23+S16 +S17+S14+L1+S15+ S11+S24+S25+S28 | S14+L1+S15+S11+ S24+S25+S28+S12+ S13+L2+S22+S23+S2 6+S27 | L1+S11+L3+S21+S24 +S25+S18+S12+S13+ L2+S22+S23+S26+ S27 |
| Mask Bit 1 | L2 + L4 +S22 + S23 + S16 +L3+S21+S14 + S15 | L3+S21+S14+S15+ S12 + L2 + S13 + S22 + S23 + S26 | S12+L2+S13+S22+ S23+S26+L3+L1+S11 + S21+S24+S25 | L2+L4+S22+S23+S16 +L3+S11+L1+S21+ S24+S25 |
| Flushed out | | | | | |
| Flushed out | | | | | |
| Flushed out | | | | | |

FIG. 7E

PRPG state after each clock cycle

| | | | | | |
|---|---|---|---|---|---|
| After cycle 5 | S12 + S13 + L2 + S22 + S23 + S26 + S27 + S110 | L3 + S11 + L1 + S21 + S24 + S25 + S18 + S19 | L4 + S16 + S17 + S12 + S26 + S27 + S210 | S14 + S15 + L1 + S11 + S24 + S25 + S28 + S29 |
| After cycle 4 | L1 + S11 + L3 + S21 + S24 + S25 + S18 | L2 + L4 + S22 + S23 + S16 + S17 | S14 + L1 + S15 + S11 + S24 + S25 + S28 | S12 + S13 + L2 + S22 + S23 + S26 + S27 |
| After cycle 3 | L2 + L4 + S22 + S23 + S16 | L3 + S21 + S14 + S15 | S12 + L2 + S13 + S22 + S23 + S26 | L1 + S11 + L3 + S21 + S24 + S25 |
| After cycle 2 | L3 + S21 + S14 | L4 + S12 + S13 | L3 + S21 + L1 + S11 + S24 | L2 + L4 + S22 + S23 |
| After cycle 1 | L4 + S12 | L1 + S11 | S14 + L1 + S11 + S24 | L3 + S21 |
| Initial State | L1 | L2 | L3 | L4 |

FIG. 7F

Equations for Masking bits after running for 5 scan clock cycles

| Mask | L3+S11+L1+S21+S24+S25+S18+L2+L4+S2+S23+S16+S17 | L2+L4+S22+S23+S16+S17+S14+L1+S15+S11+S24+S25+S28 | S14+L1+S15+S11+S24+S25+S28+S12+S13+L2+S22+S23+S26+S27 | L1+S11+L3+S21+S24+S25+S18+S12+S13+L2+S22+S23+S26+S27 |
|---|---|---|---|---|
| Flushed out | | | | |
| Flushed out | | | | |
| Flushed out | | | | |
| Flushed out | | | | |

FIG. 7H

PRPG state after each clock cycle

| | | | | | |
|---|---|---|---|---|---|
| After cycle 5 | S12 + S13 + L2 + S22 + S23 + S26 + S27 + S110 | L3 + S11 + L1 + S21 + S24 + S25 + S18 + S19 | L4 + S16 + S17 + S12 + S13 + S26 + S27 + S210 | S14 + S15 + L1 + S11 + S24 + S25 + S28 + S29 | L1+S11+L3 +S21+S24 + S25 |
| After cycle 4 | L1 + S11 + L3 + S21 + S24 + S25 + S18 | L2 + L4 + S22 + S23 + S16 + S17 | S14 + L1 + S15 + S11 + S24 + S25 + S28 | S12 + S13 + L2 + S22 + S23 + S26 + S27 | |
| After cycle 3 | L2 + L4 + S22 + S23 + S16 | L3 + S21 + S14 + S15 | S12 + L2 + S13 + S22 + S23 + S26 | L1 + S11 + L3 + S21 + S24 + S25 | |
| After cycle 2 | L3 + S21 + S14 | L4 + S12 + S13 | L3 + S21 + L1 + S11 + S24 | L2 + L4 + S22 + S23 | |
| After cycle 1 | L4 + S12 | L1 + S11 | L2 + L4 + S22 | L3 + S21 | |
| Initial State | L1 | L2 | L3 | L4 | |

| Mask | Equations for Masking bits after running for 5 scan clock cycles | | | |
|---|---|---|---|---|
| | L3+S11+L1+S21+S24 +S25+S18+L2+L4+S2 2+S23+S16+S17 | L2+L4+S22+S23+S16 +S17+S14+L1+S15+ S11+S24+S25+S28 | S14+L1+S15+S11+ S24+S25+S28+S12+ S13+L2+S22+S23+S2 6+S27 | L1+S11+L3+S21+S24 +S25+S18+S12+S13+ L2+S22+S23+S26+ S27 |
| Flushed out | | | | |
| Flushed out | | | | |
| Flushed out | | | | |
| Flushed out | | | | |

FIG. 7L

| | PRPG state after each clock cycle | | | |
|---|---|---|---|---|
| After cycle 5 | S12 + S13 + L2 + S22 + S23 + S26 + S27 + S110 | L3 + S11 + L1 + S21 + S24 + S25 + S18 + S19 | L4 + S16 + S17 + S12 + S13 + S26 + S27 + S210 | S14 + S15 + L1 + S11 + S24 + S25 + S28 + S29 |
| After cycle 4 | L1 + S11 + L3 + S21 + S24 + S25 + S18 | L2 + L4 + S22 + S23 + S16 + S17 | S14 + L1 + S15 + S11 + S24 + S25 + S28 | S12 + S13 + L2 + S22 + S23 + S26 + S27 |
| After cycle 3 | L2 + L4 + S22 + S23 + S16 | L3 + S21 + S14 + S15 | S12 + L2 + S13 + S22 + S23 + S26 | L1 + S11 + L3 + S21 + S24 + S25 |
| After cycle 2 | L3 + S21 + S14 | L4 + S12 + S13 | L3 + S21 + L1 + S11 + S24 | L2 + L4 + S22 + S23 |
| After cycle 1 | L4 + S12 | L1 + S11 | L2 + L4 + S22 | L3 + S21 |
| Initial State | L1 | L2 | L3 | L4 |

REDUCING MASK DATA VOLUME WITH ELASTIC COMPRESSION

TECHNICAL FIELD

The present application relates to systems and methods for loading mask data during the testing of integrated circuit designs.

CROSS-REFERENCE TO RELATED APPLICATIONS

This application is related to U.S. patent application Ser. No. 14/737,331, filed Jun. 11, 2015, entitled "ELASTIC COMPRESSION—OPTIMIZING TESTER BANDWIDTH WITH COMPRESSED TEST STIMULI USING OVERSCAN AND VARIABLE SERIALIZATION," the disclosure of which is incorporated by reference herein in its entirety.

BACKGROUND

Automatic test pattern generation ("ATPG") was developed to explicitly test each gate and path in an integrated circuit ("IC") design. As ICs have become larger and more complex, the amount of logic to be tested per input/output test pin has increased dramatically.

Test Compression is a technique used as part of a Design For Test ("DFT") method to reduce the time and cost of testing integrated circuits. Straightforward application of scan techniques can result in large vector sets with corresponding long tester time and memory requirements. Test Compression takes advantage of the small number of significant values (care bits) techniques to reduce test data and test time, by decompressing the scan input on chip and compressing the test output. This technique allows highly compressed test stimuli to be applied from low-pin count testers and compressed test responses to be measured.

Scan channels are typically loaded by shifting them into the design registers 1 bit per clock cycle and thus, the longer the scan channels the more time it takes to load. The loading and unloading of long scan channels is not a very efficient use of tester time. A Test decompressor allows compressed test stimuli to be loaded from a small number of tester pins to a large number of very short internal scan channels; thereby reducing the test loading time. On the output side the short scan channels feeding a test compressor can reduce the time taken to unload the test response and store it on the tester for comparison.

The effectiveness of Test Compression can be degraded if the scan elements capture unknown logic states ("X-states"). X-states can occur for a variety of reasons, such as: (1) ATPG cannot accurately model certain logic modules and the un-modeled logic gets captured at a scan element (e.g., scan flip-flop), (2) internal three-state logic that could go to high-Z (i.e., high impedance), (3) uninitialized non-scan flip-flop/latches that cannot be reset prior to scan test application, (4) unknown RAM output (e.g., output of RAM may be unknown if not all of the RAM bits have time to get to logical "0" after a chip powers on), (5) a third-party vendor does not provide enough data to determine all of the possible outputs after a chip is powered on and, thus, X-states have to be assumed for the undetermined outputs, (6) some of the gates being tested are fed by analog logic (i.e., which does not use logical "1s" and "0s"), and (7) at-speed delay tests in which not all of the paths can meet the desired timings. Further, contrary to full-scan designs, in which X-states can be easily detected and suppressed, a single X-state found within a compression environment will likely combine with other non X-states (i.e., known values) and, thus, corrupt those values before they can be observed at the output of the compression. As such, as the X-states are shifted through the compression logic, the compression efficiency is adversely affected, resulting in a higher pattern count and lower test coverage.

On-chip masking hardware overcomes the above-discussed "X-state" problem. Essentially, ATPG applies masking logic to ensure targeted faults are not corrupted by an X-state. The masking logic masks the captured X-state and ensures that the masked "X-state" is instead read as a known value (i.e., a logical "0" or "1"). Current masking hardware solutions include a "WIDE1" channel mask and a "WIDE2" channel mask. With a "WIDE1" channel mask, each scan channel tail is monitored by a single mask register bit to prevent X-value propagation into the compression logic; therefore providing the ability to mask the channel on a per scan cycle basis. With a "WIDE2" channel mask, each scan channel tail is monitored by two mask register bits, thus providing ATPG greater flexibility in suppressing the "X-states" from affecting compression. For both "WIDE1" and "WIDE2" channel masking, mask data is serially loaded to the mask register bits via the scan-in input pins. The loading time to serially load the mask register bits is equivalent to the number of compression channels N divided by the number of scan inputs M (i.e., N/M). Each scan-input M provides mask data for N/M mask register bits. In addition, because the required mask data for the mask register bits changes on a pattern-to-pattern basis, new mask data has to be loaded for each test pattern.

As the compression logic grows, the number of required mask register bits and, thus, loading time also increases (e.g., corresponding to an increase in scan channels). For example, for a compressed design with 8 scan-in inputs and 3200 channels, 400 clock cycles would be required to load all of the mask register bits for one pattern. Assuming that the scan channel length L is less than 400 (e.g., scan channel length L is less than 100), this means it would to take longer to load the mask data than to load the actual scan channel data. Accordingly, as the loading time for the mask data increases, the test time and total data volume (i.e., due to an increase in mask data storage volume) also increases, defeating one of the primary motivations for test compression, i.e., decreasing test time and total data volume.

As such, there is a need for an efficient method and system of loading mask data to the mask register bits without having to serially load the mask data via the scan-in inputs.

BRIEF DESCRIPTION OF THE DRAWINGS

FIG. 3A illustrates an embodiment of a WIDE1 channel masking system utilizing direct loading of the mask register bits from the decompression network outputs.

FIG. 3B illustrates the linear equations for the mask register bits after the embedded sequential decompressor of FIG. 3A is primed to a specific value.

FIG. 3C illustrates the state of each bit in the embedded sequential decompressor of FIG. 3A.

FIG. 4A illustrates a first embodiment of a WIDE2 channel masking system utilizing direct loading of the mask register bits from the decompression network outputs.

FIG. 4B illustrates the linear equations for the mask register bits after the embedded sequential decompressor of FIG. 4A is primed to a specific value.

FIG. 4C illustrates the state of each bit in the embedded sequential decompressor of FIG. 4A.

FIG. 5D illustrates a second part of the second embodiment of a WIDE2 channel masking system utilizing direct loading of the mask register bits from the decompression network outputs.

FIG. 5E illustrates the linear equations for the mask register bits after the embedded sequential decompressor of FIG. 5D is primed to a specific value.

FIG. 5F illustrates the state of each bit in the embedded sequential decompressor of FIG. 5D.

FIG. 7E illustrates the linear equations for the mask register bits after the embedded sequential decompressor of FIG. 7D is primed to a specific value.

FIG. 7F illustrates the state of each bit in the embedded sequential decompressor of FIG. 7D.

FIG. 7H illustrates the linear equations for the mask register bits after the embedded sequential decompressor of FIG. 7G is primed to a specific value.

FIG. 7I illustrates the state of each bit in the embedded sequential decompressor of FIG. 7G.

FIG. 7K illustrates the linear equations for the mask register bits after the embedded sequential decompressor of FIG. 7J is primed to a specific value.

FIG. 7L illustrates the state of each bit in the embedded sequential decompressor of FIG. 7J.

DESCRIPTION OF EMBODIMENTS

The following description of embodiments provides non-limiting representative examples referencing numerals to particularly describe features and teachings of different aspects of the invention. The embodiments described should be recognized as capable of implementation separately, or in combination, with other embodiments from the description of the embodiments. A person of ordinary skill in the art reviewing the description of embodiments should be able to learn and understand the different described aspects of the invention. The description of embodiments should facilitate understanding of the invention to such an extent that other implementations, not specifically covered but within the knowledge of a person of skill in the art having read the description of embodiments, would be understood to be consistent with an application of the invention.

One aspect of the present disclosure is to provide systems and methods for efficiently loading mask data to the mask register bits without having to serially load the mask data in. The methods and apparatuses herein address at least one of the ATPG problems described above. Accordingly, a method of directly loading mask data from the decompression network outputs is provided.

According to an embodiment, a system for loading a mask flop bit register of an automatic test pattern generation system includes: a sequential decompressor, configured to receive m scan inputs from a tester; and a combinational decompressor network receiving a plurality of outputs from the sequential decompressor, wherein the mask flop bit register is configured to receive a plurality of outputs from the combinational decompressor network.

Figure 1:
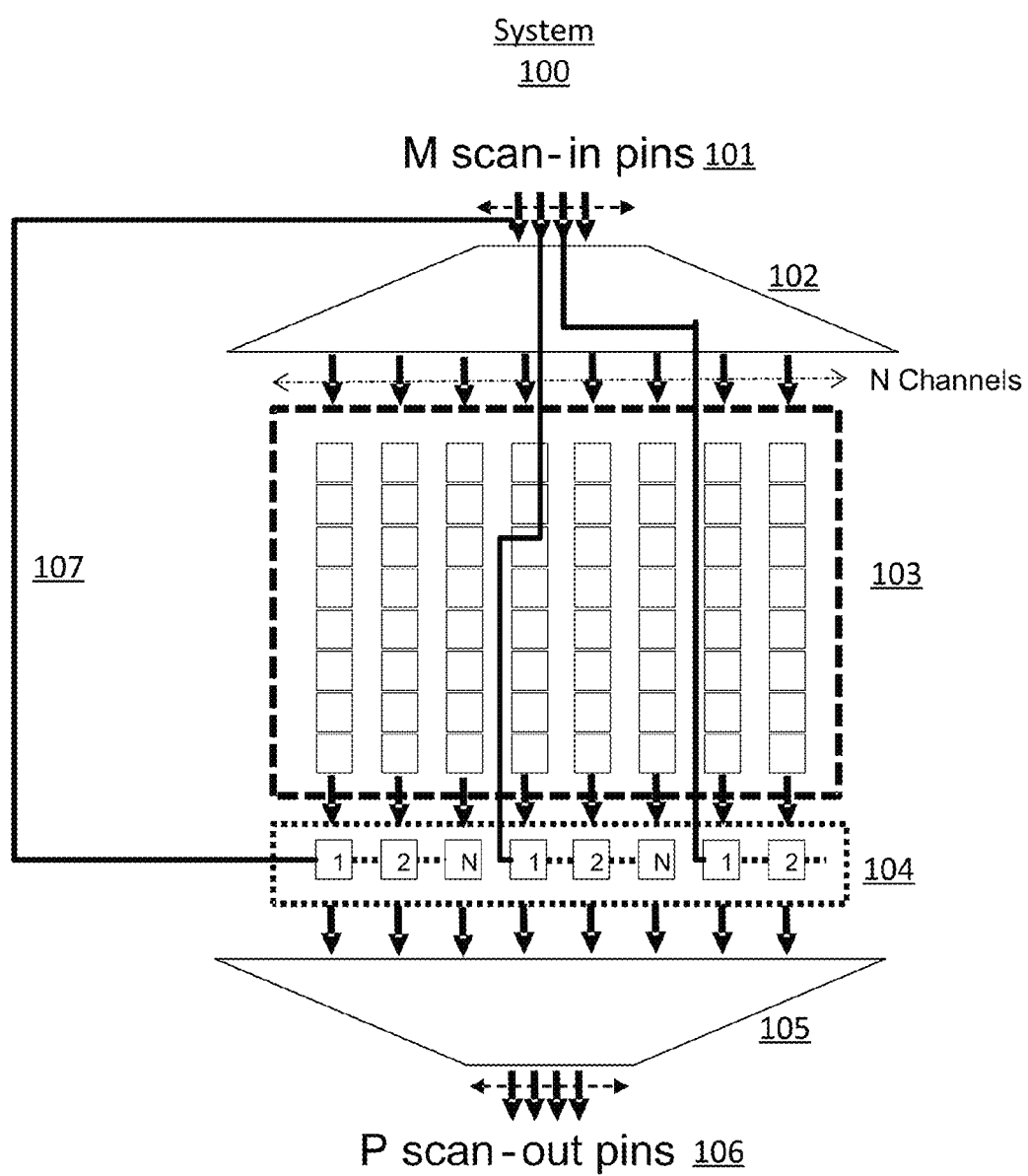
FIG. 1 illustrates elements of a test compression network system.

FIG. 1 illustrates elements of a test compression network system. System 100 includes M scan-in pins 101, decompressor network 102, test cube 103, mask register 104, compressor network 105, P scan-out pins 106 and mask load connection(s) 107. The M scan-in pins 101 are fed data (e.g., scan data, mask data, etc.) from a storage volume (not shown). The M scan-in pins 101 feed the decompressor network 102 as well as the mask register 104. The decompressor network 102 feeds the N scan channels of test cube 103. Further, each scan-in pin 101 feeds N/M bits of the mask register 104 via the mask load connection(s) 107. The mask data is serially loaded into the mask register 104 before the ATPG enters the scan state but after the launch/capture window (i.e., the X-state(s) will most likely be captured by the observation flops during the launch/capture window of the test protocol). The mask register bits of the mask register 104 determine whether a value captured by a corresponding scan channel element in the test cube 103 is masked before entry into the compressor network 105 (i.e., due to an X-state). The masking occurs at the tail-end of the internal scan channels of test cube 103. The output of the compressor network 105 is fed via the P scan-out pins 106 to a storage volume (not shown) for later comparison and analysis.

Figure 2:
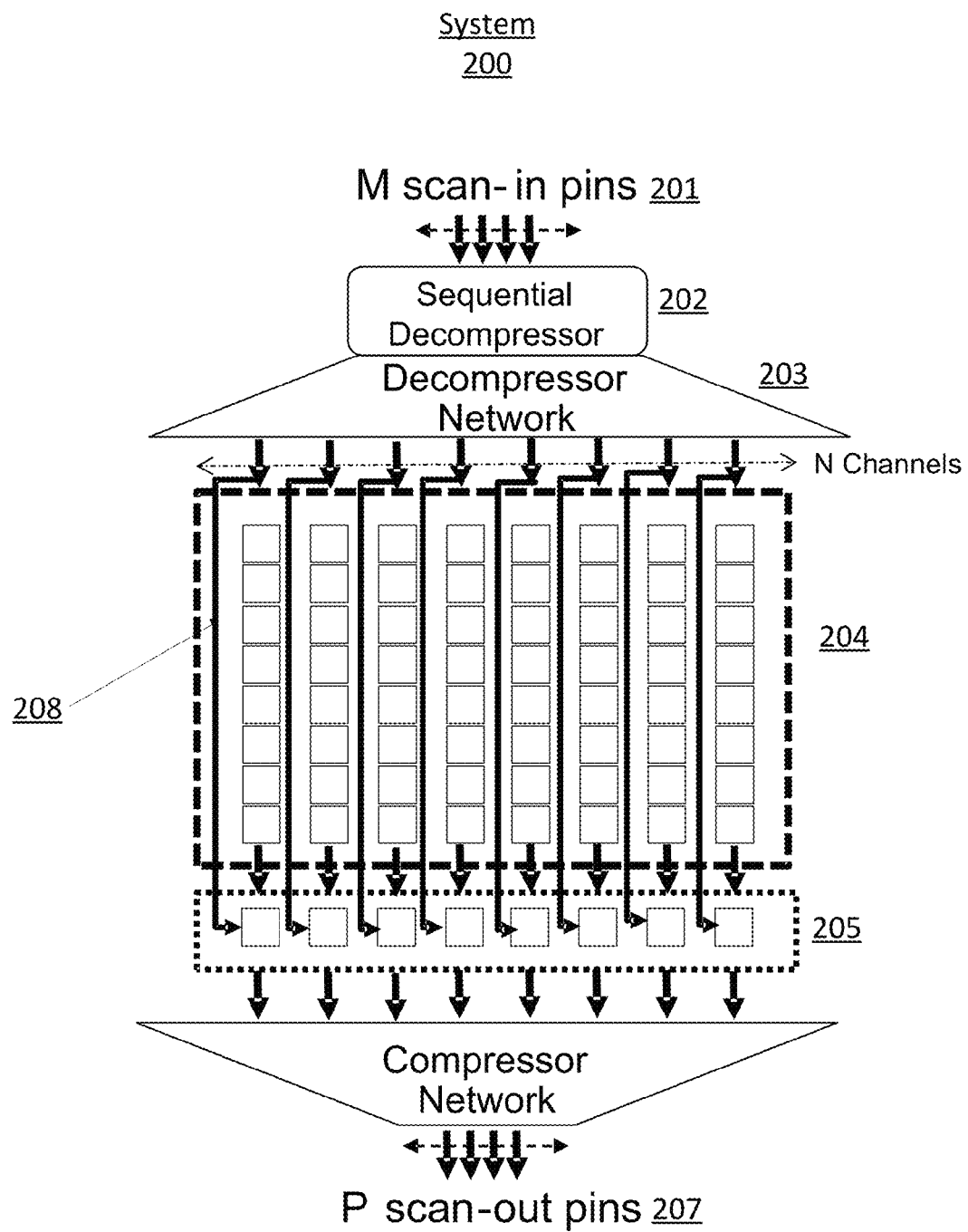
FIG. 2 illustrates an embodiment of a test compression network system utilizing direct loading of the mask register bits from the decompression network outputs.

FIG. 2 illustrates an embodiment of a test compression network system utilizing direct loading of the mask register bits from the decompression network outputs. System 200 includes M scan-in pins 201, sequential decompressor 202 (e.g., a first-in, first-out ("FIFO") linear shift register, PRPG, etc.), decompressor network 203 (e.g., linear spreader network of XOR logic gates, Illinois scan/broadcast scan distribution network, etc.), test cube 204, mask register 205 (e.g., WIDE1, WIDE2, etc.), compressor network 206 (e.g., linear compressing network of XOR logic gates, multiple input signature register ("MISR"), Hybrid (XOR logic gates and MISR), etc.), P scan-out pins 207 and mask load connection(s) 208. In an embodiment, the M scan-in pins 201 are fed data (e.g., scan data, mask data, etc.) from a storage volume (not shown). The M scan-in pins 201 feed a sequential decompressor 202. The output of the sequential decompressor 202 feeds a decompressor network 203. In an embodiment, in addition to feeding scan data to the scan channels of the test cube 204, the decompressor network 203 also feeds mask data to the mask register 205. Specifically, each output of the decompressor network 203 feeds a corresponding mask register bit in the mask register 205 via the mask load connection(s) 208. Accordingly, a mask load connection 208 exists between every output of the decompressor network 203 and a corresponding mask register bit in the mask register 205. In an embodiment, the mask data is loaded into the mask register 205 before the ATPG enters the scan state but after the launch/capture window. The mask register bits of the mask register 205 (combined with a channel mask enable not shown here) determine whether a value captured by a corresponding scan channel element in the test cube 204 is masked before entry into the compressor network 206 (i.e., due to an X-state). The masking occurs at the tail-end of the internal scan channels of test cube 204. Further, in an embodiment, the output of the compressor network 206 is fed via the P scan-out pins 207 to a storage volume (not shown) for later comparison and analysis.

FIG. 3A illustrates an embodiment of a WIDE1 channel masking system utilizing direct loading of the mask register bits from the decompression network outputs. System 300, which receives input signals 301 from the tester, includes a sequential decompressor 302 (e.g., a PRPG), a combinational decompressor 303 (e.g., XOR decompressor) and a mask flop bit register 304. In an embodiment, two bits of data come in from the tester as input signals 301 for each clock cycle. For example, at the first clock cycle, $S_{11}$ and $S_{21}$ come in as input signals 301. In the next scan cycle, $S_{12}$ and $S_{22}$ come in as input signals 301, etc. Input signals 301 are input into PRPG 302 and shifted into shift registers of PRPG 302 for each clock cycle. In an embodiment, each of the signals (e.g., $S_{11}$ and $S_{21}$) is input into a corresponding tap point of the PRPG 302. In another embodiment (not shown), each of the signals (e.g., $S_{11}$ and $S_{21}$) is formed out to a plurality of tap points of the PRPG 302 (i.e., a duplicate of the signal is sent to each tap point). Further, input signals 301 are XORed with the shifted values of PRPG 302 (including initial state values of the shift registers $L_1$, $L_2$, $L_3$ and $L_4$) for each clock cycle. In an embodiment, the outputs of the shift registers $L_1$, $L_2$, $L_3$ and $L_4$ are fed to an XOR decompressor 303. The output of XOR decompressor 303 is input to the mask flop bit register 304 at each clock cycle.

In an embodiment, the shift registers of PRPG 302 and the mask flop bit register 304 are updated at each tester cycle. For example, mask data is first shifted down into the mask flop bit register 304 and, then, the PRPG 302 is pulsed with the input variables (i.e., although the scan channels also capture values from the PRPG registers and XOR decompressor during the scan load state of the test protocol, the scan channels are not updated during the mask register load state of the test protocol and, instead, the mask registers are enabled/clocked to update values in the mask registers with values contained in the PRPG registers and the XOR decompressor).

FIG. 3B illustrates the linear equations for the mask register bits after the embedded sequential decompressor of FIG. 3A is primed to a specific value. Specifically, FIG. 3B illustrates the linear equations for the scan channel bits after the embedded sequential decompressor of FIG. 3A runs for five clock cycles. As depicted in FIG. 3B, after five clock cycles, the linear equations for the scan channel bits for the last clock cycle (e.g., the top slice) all include input variables (e.g., data from input signals 301). As such, the mask bits (i.e., $M_1$, $M_2$, $M_3$ and $M_4$) have a better probability of being solved with the equations in the top slice. Specifically, in an embodiment, an equation solver (not shown) solves for the variables (e.g., input signals 301) necessary to generate the desired mask bits (i.e., $M_1$, $M_2$, $M_3$ and $M_4$). Each mask bit generally corresponds to a different Boolean combination (e.g., due to the PRPG 302 and the XOR decompressor 303) of the input bit variables (e.g., input signals 301). In other words, the mask bits in the mask flop bit register 304 correspond to a system of linear equations (e.g., ax=b). With the Boolean combinations provided by the PRPG 302 and the XOR decompressor 303 (e.g., the "a") and the corresponding desired mask bit values (e.g., the "b"), the equation solver can solve for the desired scan input variables (e.g., the "x"). After the equation solver solves for the desired scan input variables, the variables are extracted to a corresponding location in a storage volume (not shown) in order to pre-load the desired mask bits at a later time.

In an embodiment, as depicted in FIG. 3B, the earlier cycles (e.g., corresponding to masking bit equations with few or no input variables) are flushed out (e.g., removed). Specifically, the figure shows four cycles being flushed out from the bottom. Accordingly, the final content of the mask flop bit register 304 will include only the top slice. In an embodiment, the masking bit loading process runs for as many clock cycles as necessary in order to prime the PRPG 302 with mostly input variables (e.g., input signal 301). FIG. 3C illustrates the state of each bit in the embedded sequential decompressor of FIG. 3A.

Figure 3D:
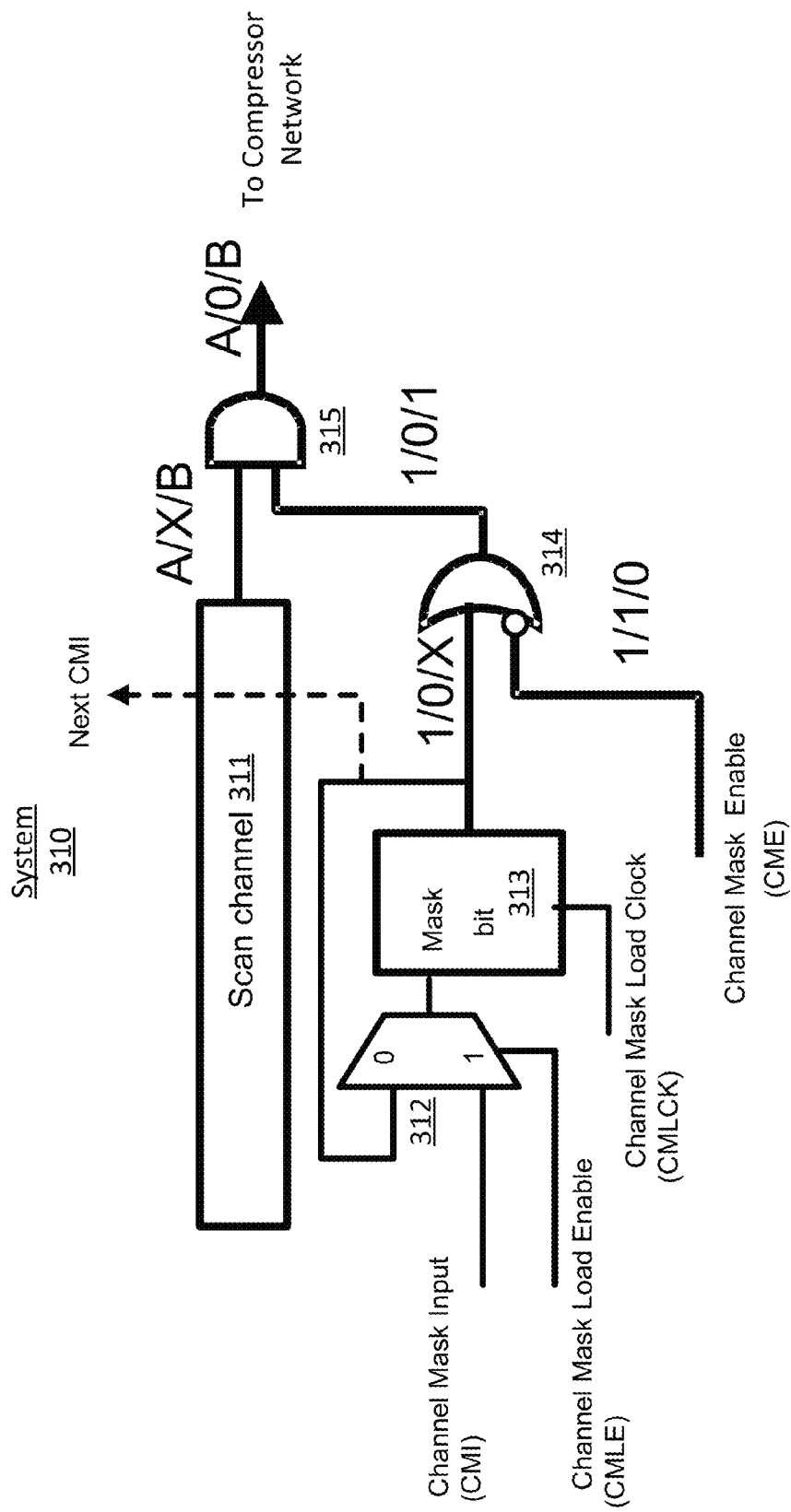
FIG. 3D illustrates the elements of the current architecture of a WIDE1 channel masking system.

FIG. 3D illustrates the elements of the current architecture of a WIDE1 channel masking system. System 310 includes a scan channel 311, multiplexer 312, mask bit 313, OR gate 314, and an AND gate 315. Under the current architecture mask bits can be pre-loaded via one or Channel Mask Inputs (CMI) when the Channel Mask Load Enable (CMLE) pin is asserted. A global Channel Mask Enable (CME) pin determines if the mask bit should be applied to the current scan cycle. The mask bit 313 is a storage element with a clock Channel Mask Load Clock (CMLCK) which can be shared with other test clocks. The mask data for the mask bit 313 is loaded at the CMI pin via scan input pins and can be serially moved to the next CMI pin of the following mask bit.

Figure 3E:
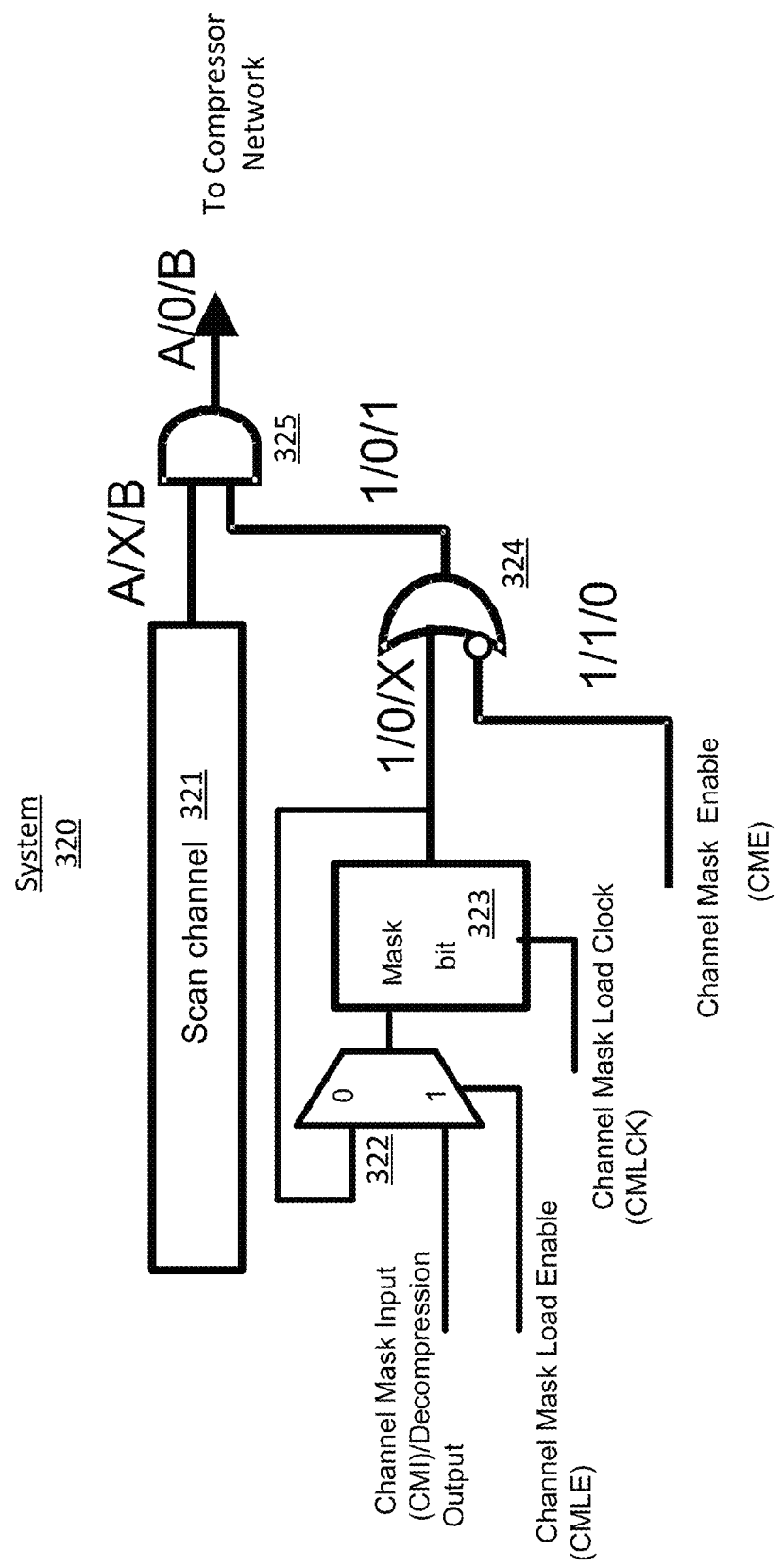
FIG. 3E illustrates the elements of a WIDE1 channel masking system utilizing direct loading of the mask register bits from the decompression network outputs.

FIG. 3E illustrates the elements of a WIDE1 channel masking system utilizing direct loading of the mask register bits from the decompression network outputs. Similar to system 310 of FIG. 3D, system 320 includes a scan channel 321, multiplexer 322, mask bit 323, OR gate 324, and an AND gate 325. In an embodiment, contrary to system 310 of FIG. 3D, the mask data for mask bits 313 is loaded at the CMI pin via one of the outputs of the decompression network. Accordingly, there is no need to serially move mask data to the next CMI pin of the following mask bit.

FIG. 4A illustrates a first embodiment of a WIDE2 channel masking system utilizing direct loading of the mask register bits from the decompression network outputs. System 400, which receives input signals 401 from the tester, includes a sequential decompressor 402 (e.g., a PRPG), a combinational decompressor 403 (e.g., XOR decompressor) and mask flop bit registers 404 including Mask Flop Bit Register 0 and Mask Flop Bit Register 1. In an embodiment, two bits of data come in from the tester as input signals 401 for each clock cycle. For example, at the first clock cycle, $S_{11}$ and $S_{21}$ come in as input signals 401. In the next scan cycle, $S_{12}$ and $S_{22}$ come in as input signals 401, etc. Input signals 401 are input into PRPG 402 and shifted into shift registers of PRPG 402 for each clock cycle. In an embodiment, each of the signals (e.g., $S_{11}$ and $S_{21}$) is input into a corresponding tap point of the PRPG 402. In another embodiment (not shown), each of the signals (e.g., $S_{11}$ and $S_{21}$) is formed out to a plurality of tap points of the PRPG 402 (i.e., a duplicate of the signal is sent to each tap point). Further, input signals 401 are XORed with the shifted values of PRPG 402 (including initial state values of the shift registers $L_1$, $L_2$, $L_3$ and $L_4$) for each clock cycle. In an embodiment, the outputs of the shift registers $L_1$, $L_2$, $L_3$ and $L_4$ are fed to an XOR decompressor 403. The output of XOR decompressor 403 is input to the mask flop bit registers 404 at each clock cycle.

In an embodiment, the shift registers of PRPG 402 and the mask flop bit registers 404 are updated at each tester cycle. For example, mask data is first shifted down into the mask flop bit registers 404 and, then, the PRPG 402 is pulsed with the input variables (i.e., although the scan channels also capture values from the PRPG registers and XOR decompressor during the scan load state of the test protocol, the scan channels are not updated during the mask register load state of the test protocol and, instead, the mask registers are enabled/clocked to update values in the mask registers with values contained in the PRPG registers and the XOR decompressor).

FIG. 4B illustrates the linear equations for the mask register bits after the embedded sequential decompressor of FIG. 4A is primed to a specific value. Specifically, FIG. 4B illustrates the linear equations for the scan channel bits after the embedded sequential decompressor of FIG. 4A runs for five clock cycles. As depicted in FIG. 4B, after five clock cycles, the linear equations for the scan channel bits for the last two clock cycles (e.g., the top two slices) all include input variables (e.g., data from input signals 401). Therefore, the mask bits of Mask Flop Bit Register 0 and Mask Flop Bit Register (i.e., $M_{11}$, $M_{21}$, $M_{31}$, $M_{41}$, $M_{12}$, $M_{22}$, $M_{32}$, and $M_{42}$) have a better probability of being solved with the equations in the top two slices. In an embodiment, the equation solver solves the system of linear equations for both slices simultaneously instead of slice-by-slice. After the equation solver solves for the desired scan input variables, the variables are extracted to a corresponding location in a storage volume (not shown) in order to pre-load the desired mask bits at a later time.

In an embodiment, as depicted in FIG. 4B, the earlier cycles (e.g., corresponding to masking bit equations with few or no input variables) are flushed out (e.g., removed). Specifically, the figure shows three cycles being flushed out from the bottom. Accordingly, the final content of the mask flop bit registers 404 will include only the top two slices.

FIG. 4C illustrates the state of each bit in the embedded sequential decompressor of FIG. 4A.

Figure 4D:
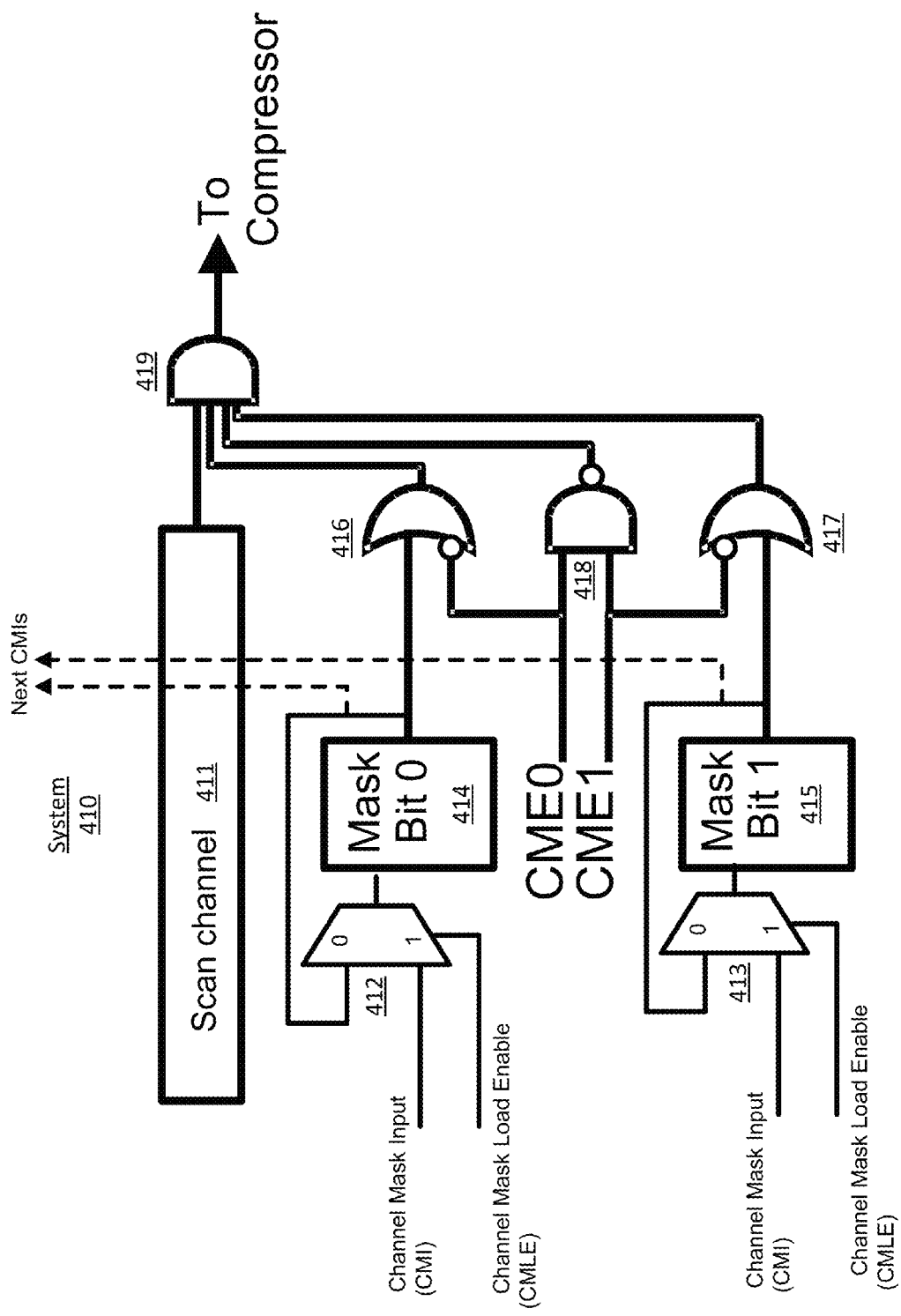
FIG. 4D illustrates the elements of the current architecture of a WIDE2 channel masking system.

FIG. 4D illustrates the elements of the current architecture of a WIDE2 channel masking system. System 410 includes a scan channel 411, first multiplexer 412, second multiplexer 413, first mask bit 414, second mask bit 415, first OR gate 416, second OR gate 417, first AND gate 418 and second AND gate 419. Similar to the WIDE1 channel masking system in FIG. 3D, under the current architecture, mask bits can be pre-loaded via one or more CMI pins when the CMLE pin is asserted. Further, channel mask enable signals CME0 and CME1, in conjunction with mask bits 414 and 415, determine which channel(s) of a scan cycle to mask. The mask data for mask bits 414 and 415 are loaded serially via scan input pins. The data is propagated through the next CMI's path to connect all mask bits together to ensure loading of data.

Figure 4E:
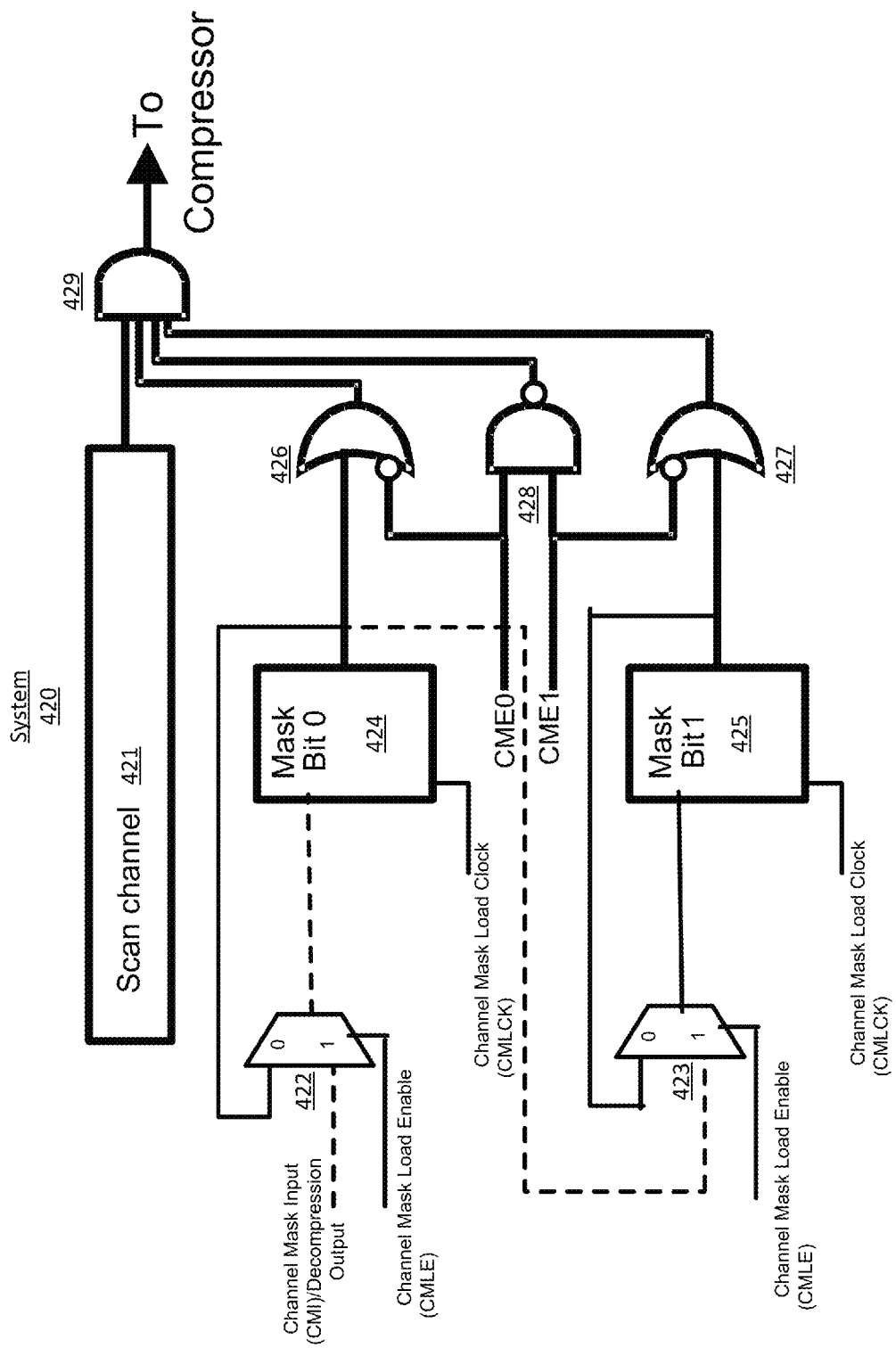
FIG. 4E illustrates the elements of the first embodiment of a WIDE2 channel masking system utilizing direct loading of the mask register bits from the decompression network outputs.

FIG. 4E illustrates the elements of the first embodiment of a WIDE2 channel masking system utilizing direct loading of the mask register bits from the decompression network outputs. Similar to system 410 of FIG. 4D, system 420 includes a scan channel 421, first multiplexer 422, second multiplexer 423, first mask bit 424, second mask bit 425, first OR gate 426, second OR gate 427, first AND gate 428 and second AND gate 429. In an embodiment, contrary to system 410 of FIG. 4D, the mask data for mask bit 424 is loaded at the CMI pin via the output of the decompression network. Further, in an embodiment, the mask data for mask bit 425 is loaded at the CMI pin from the output of mask bit 424. In other words, the mask data for mask bits 424 and 425 are serially loaded.

Figures 5A, 5B, 5C:
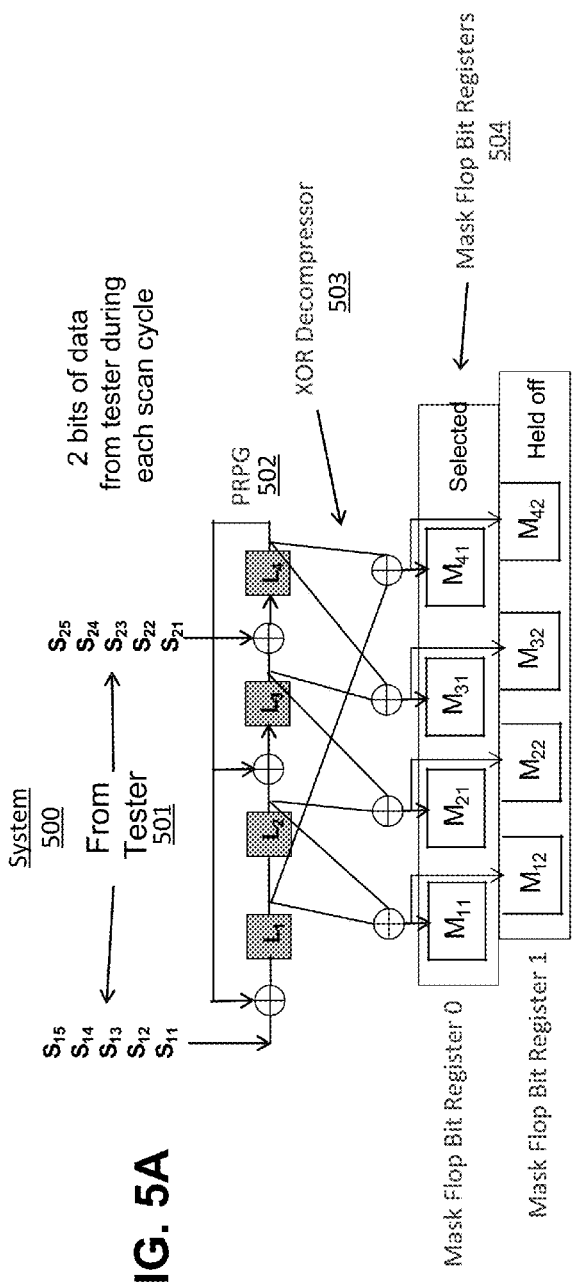
FIG. 5A illustrates a first part of a second embodiment of a WIDE2 channel masking system utilizing direct loading of the mask register bits from the decompression network outputs.
FIG. 5B illustrates the linear equations for the mask register bits after the embedded sequential decompressor of FIG. 5A is primed to a specific value.
FIG. 5C illustrates the state of each bit in the embedded sequential decompressor of FIG. 5A.

FIG. 5A illustrates a first part of a second embodiment of a WIDE2 channel masking system utilizing direct loading of the mask register bits from the decompression network outputs. In an embodiment, system 500 is similar to system 400 except that instead of serially loading both Mask Flop Bit Register 0 and Mask Flop Bit Register 1, only Mask Flop Bit Register 0 is loaded with mask data. In an embodiment, Mask Flop Bit Register 0 is loaded with mask data if CME1 is a logical "1" and CME0 is a logical "0." This allows for a unique solution to be defined for each mask flop register.

FIG. 5B illustrates the linear equations for the mask register bits after the embedded sequential decompressor of FIG. 5A is primed to a specific value. Specifically, FIG. 5B illustrates the linear equations for the scan channel bits after the embedded sequential decompressor of FIG. 5A runs for five clock cycles. As depicted in FIG. 5B, the earlier cycles are flushed out (e.g., removed). Specifically, the figure shows four cycles being flushed out from the bottom. Accordingly, the final content of the Mask Flop Bit Register 0 will include only the top slice. FIG. 5C illustrates the state of each bit in the embedded sequential decompressor of FIG. 5A.

FIG. 5D illustrates a second part of the second embodiment of a WIDE2 channel masking system utilizing direct loading of the mask register bits from the decompression network outputs. In an embodiment, after Mask Flop Bit Register 0 is loaded with mask data as depicted in FIG. 5A, Mask Flop Bit Register 0 is then held off and, instead, Mask Flop Bit Register 1 is loaded with mask data. In an embodiment, Mask Flop Bit Register 1 is loaded with mask data if CME1 is a logical "0" and CME0 is a logical "1."

FIG. 5E illustrates the linear equations for the mask register bits after the embedded sequential decompressor of FIG. 5D is primed to a specific value. Specifically, FIG. 5E illustrates the linear equations for the scan channel bits after the embedded sequential decompressor of FIG. 5D runs for five clock cycles. As depicted in FIG. 5E, the earlier cycles are flushed out (e.g., removed). Specifically, the figure shows four cycles being flushed out from the bottom. Accordingly, the final content of the Mask Flop Bit Register 1 will include only the top slice. FIG. 5F illustrates the state of each bit in the embedded sequential decompressor of FIG. 5D.

Figure 5G:
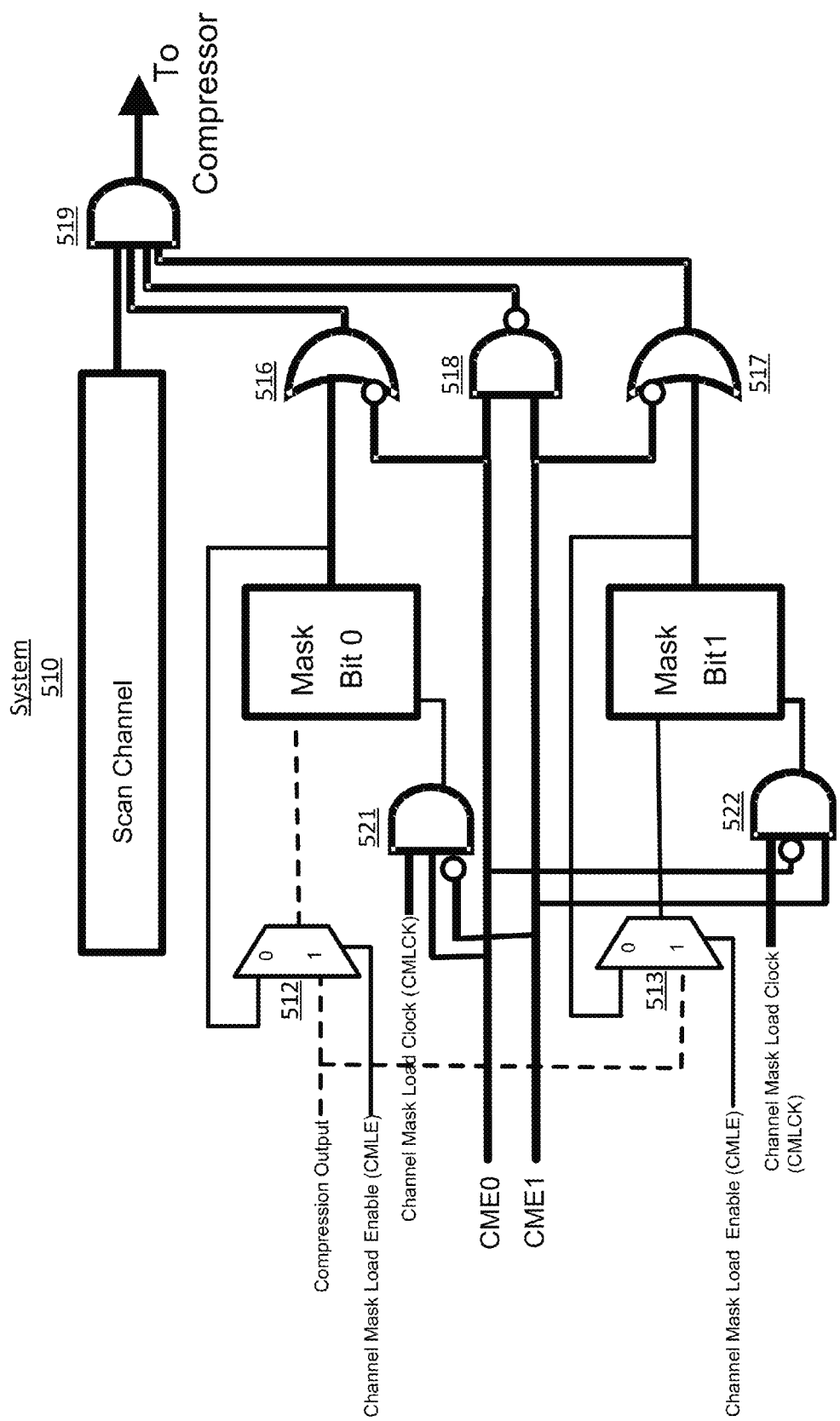
FIG. 5G illustrates the elements of the second embodiment of a WIDE2 channel masking system utilizing direct loading of the mask register bits from the decompression network outputs.

FIG. 5G illustrates the elements of the second embodiment of a WIDE2 channel masking system utilizing direct loading of the mask register bits from the decompression network outputs. Similar to system 410 of FIG. 4D, system 510 includes a scan channel 511, first multiplexer 512, second multiplexer 513, first mask bit 514, second mask bit 515, first OR gate 516, second OR gate 517, first AND gate 518 and second AND gate 519. In an embodiment, contrary to system 510 of FIG. 4D, the mask data for mask bits 514 and 515 are loaded at the respective CMI pins via the same output of the decompression network. Further, channel mask decode logic is utilized with the Channel Mask Load Clocks in order to enable separate clocking for Mask Flop Bit Register 0 and Mask Flop Bit Register 1. Specifically, first clock AND gate 521 and second clock AND gate 522 are utilized in order to enable separate clocking. For example, first clock AND gate 521 includes, as inputs, (1) Channel Mask Load Clock, (2) CME0 and (3) the inverse of CME1. Similarly, second clock AND gate 522 includes, as inputs, (1) Channel Mask Load Clock, (2) CME1 and (3) the inverse of CME0. As such, Mask Flop Bit Register 0 and Mask Flop Bit Register 1 can independently load mask data, thus ensuring that they are not correlated to each other. Accordingly, ATPG has more control in specifying the values for the mask flop values of both of Mask Flop Bit Register 0 and Mask Flop Bit Register 1.

Figure 6:
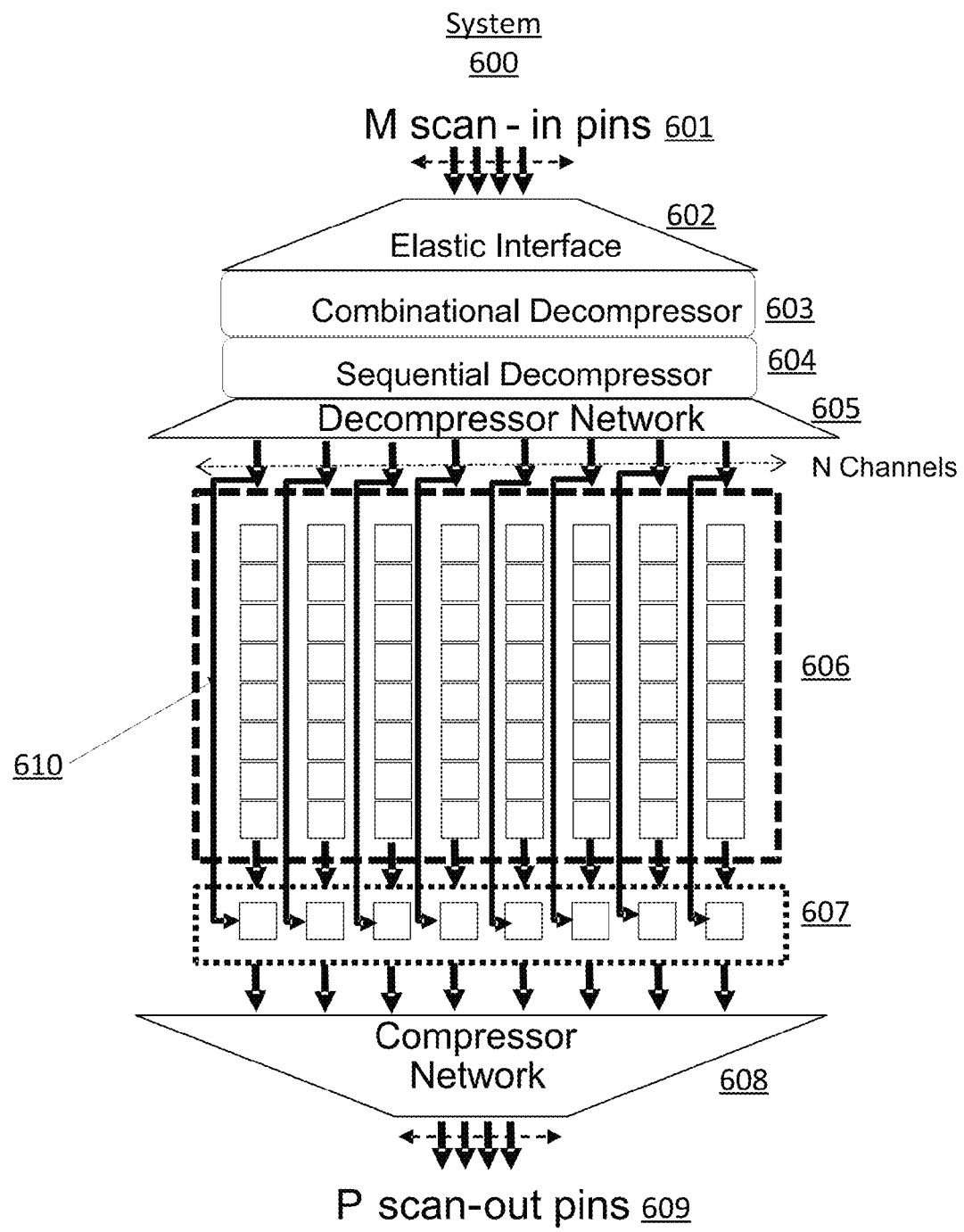
FIG. 6 illustrates an embodiment of a test compression network system with an elastic interface utilizing direct loading of the mask register bits from the decompression network outputs.

FIG. 6 illustrates an embodiment of a test compression network system with an elastic interface utilizing direct loading of the mask register bits from the decompression network outputs. System 600 includes M scan-in pins 601, elastic interface 602, combinational decompressor 603, sequential decompressor 604, decompressor network 605, test cube 606, mask register 607 (e.g., WIDE1, WIDE2, etc.), compressor network 608, P scan-out pins 609 and mask load connection(s) 610. In an embodiment, the M scan-in pins 601 are fed data (e.g., scan data, mask data, etc.) from a storage volume (not shown). The M scan-in pins 601 feed the elastic interface 602. The elastic interface 602 feeds the combinational decompressor 603. The sequential decompressor 604 feeds the decompressor network 605, which in turn feeds scan data to the channels of test cube 606. Further, similar to system 200 of FIG. 2, the decompressor network 605 also feeds mask data to the mask register 607. Specifically, each output of the decompressor network 605 feeds a corresponding mask register bit in the mask register 607 via the mask load connection(s) 610. Accordingly, a mask load connection 610 exists between every output of the decompressor network 605 and a corresponding mask register bit in the mask register 607. In an embodiment, the mask data is loaded into the mask register 607 before the ATPG enters the scan state but after the launch/capture window. The mask register bits of the mask register 607 determine whether a value captured by a corresponding scan channel element in the test cube 606 is masked before entry into the compressor network 608 (i.e., due to an X-state). The masking occurs at the tail-end of the internal scan channels of test cube 606. Further, in an embodiment, the output of the compressor network 608 is fed via the P scan-out pins 609 to a storage volume (not shown) for later comparison and analysis. In another embodiment, the elastic interface 602 feeds the sequential decompressor 604 instead of combinational decompressor 603 (i.e., combinational decompressor 603 is not utilized in system 600). In an embodiment, with the elastic interface 602, system 600 is able to provide additional variables as necessary in order to solve for the mask bits in the mask register 607. Specifically, system 600 is able to solve for certain mask bit combinations in the mask register 607 that would be deemed unsolvable by the system 200.

In an embodiment, with the elastic interface 602, system 600 is able to expand the scan cube (i.e., of the storage volume) by artificially increasing the horizontal width (e.g., x-dimension) by a factor of i without physically increasing the number of physical scan-in pins. In an embodiment, the elastic interface includes an i-bit deserializer (e.g., 2 or 4-bit) and a multiplexer stage. In an embodiment, the i-bit deserializer virtually extends the number of scan-in input pins. For example, with a 2-bit deserializer, the number of scan-in inputs M would virtually double as seen by the decompression logic under test. Therefore, the 2-bit deserializer essentially generates M virtual scan-in inputs in addition to the actual M scan-in pins 601. Similarly, with a 4-bit deserializer, the number of scan-in inputs would virtually quadruple and, therefore, 3*M virtual additional scan-in inputs would be generated. In an embodiment, the virtual scan-in inputs for either the 2-bit or 4-bit deserializer would be included as additional data the scan cube. In an embodiment, the multiplexer stage determines whether the system 600 operates with or without the i-bit deserializer of the elastic interface. Further, in an embodiment, the multiplexer stage allows the sequential decompressor 604 to be fed by either the scan-in inputs (e.g., the first state) or the output of each of the shift registers of the 2-bit deserializer (e.g., the second state). Specifically, the multiplexer stage operates in either the first or second state depending on a control signal. For example, if the control signal is logical "1," the multiplexer stage will operate under the first state. On the other hand, if the control signal is a logical "0," the multiplexer stage will operate under the second state.

In an embodiment, the combinational decompressor 603 (and decompressor network 605) corresponds to any type of decompressor (e.g., linear spreader network of XOR logic gates, Illinois scan/broadcast scan distribution network, etc.). Further, either of combinational decompressor 603 and decompressor network 605 can include a first combinational decompressor structure when the i-bit deserializer is not used and a second combinational decompressor structure when the i-bit deserializer is used. Likewise, the sequential decompressor 604 corresponds to any type of sequential decompressor (e.g., a first-in, first-out ("FIFO") linear shift register, PRPG, etc.). In other words, the elastic interface 602 can be utilized with any feasible combination of the combinational and sequential decompressors. The use of the elastic interface is described in additional detail in, e.g., U.S. patent application Ser. No. 14/737,331.

Figures 7A, 7B, 7C:
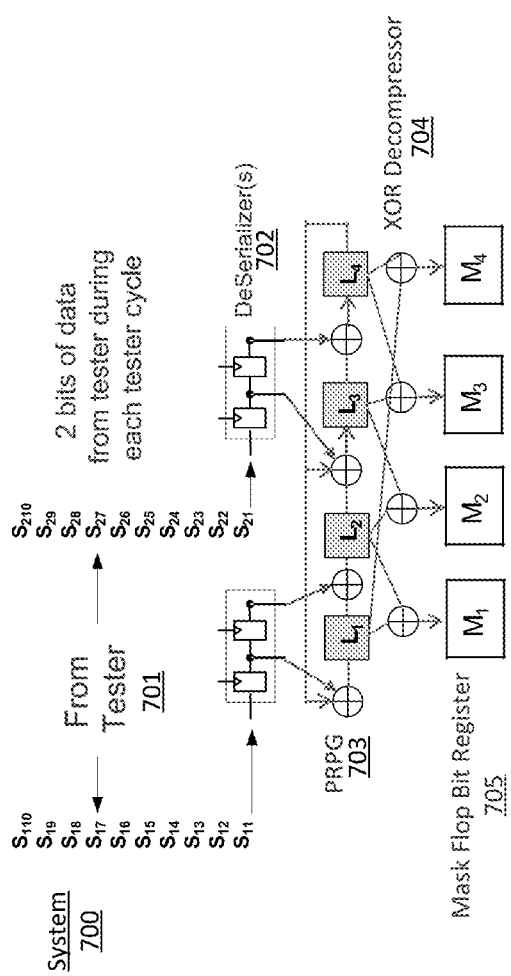
FIG. 7A illustrates an embodiment of a WIDE1 channel masking system with a 2-bit deserializer utilizing direct loading of the mask register bits from the decompression network outputs.
FIG. 7B illustrates the linear equations for the mask register bits after the embedded sequential decompressor of FIG. 7A is primed to a specific value.
FIG. 7C illustrates the state of each bit in the embedded sequential decompressor of FIG. 7A.

FIG. 7A illustrates an embodiment of a WIDE1 channel masking system with a 2-bit deserializer utilizing direct loading of the mask register bits from the decompression network outputs. System 700, which receives input signals 701 from the tester, includes deserializer(s) 702 (e.g., a 2-bit deserializer), a sequential decompressor 703 (e.g., a PRPG), a combinational decompressor 704 (e.g., XOR decompressor), and mask flop bit register 705. In an embodiment, two bits of data come in from the tester as input signals 701 for each tester cycle. For example, at the first tester cycle, $S_{11}$ and $S_{21}$ come in as input signals 701. In an embodiment, each of signals $S_{11}$ and $S_{21}$ is input into a first shift register of deserializer 702. In the next tester cycle, (i) signals $S_{11}$ and $S_{21}$ are shifted from the first shift register to a second shift register of the deserializer 702 and (ii) new input signals $S_{12}$ and $S_{22}$ are loaded onto the first shift register of the deserializer 702. Accordingly, the outputs of each of the shift registers of the deserializer 702 are fed into different tap points of PRPG 703 and shifted into shift registers of PRPG 703 for each scan cycle. Further, the outputs of the shift registers of the deserializer 702 are XORed with the shifted values of PRPG 703 (including initial state values of the shift registers $L_1$, $L_2$, $L_3$ and $L_4$) for each clock cycle. In an embodiment, the outputs of the shift registers $L_1$, $L_2$, $L_3$ and $L_4$ are fed to an XOR decompressor 704. The output of XOR decompressor 704 is input to the mask flop bit register 705 at each scan cycle. Accordingly, by feeding the input signals to several tap points of the PRPG 703, the linear equations corresponding to the mask bits of the mask flop bit register 705 will be supplied with more variables. Thus, the equation solver will be provided with more degrees of freedom when attempting to solve for those mask bits.

FIG. 7B illustrates the linear equations for the mask register bits after the embedded sequential decompressor of FIG. 7A is primed to a specific value. Similar to FIG. 3B, in FIG. 7B, the final content of the mask flop bit register 705 will include only the top slice. FIG. 7C illustrates the state of each bit in the embedded sequential decompressor of FIG. 7A.

Figure 7D:
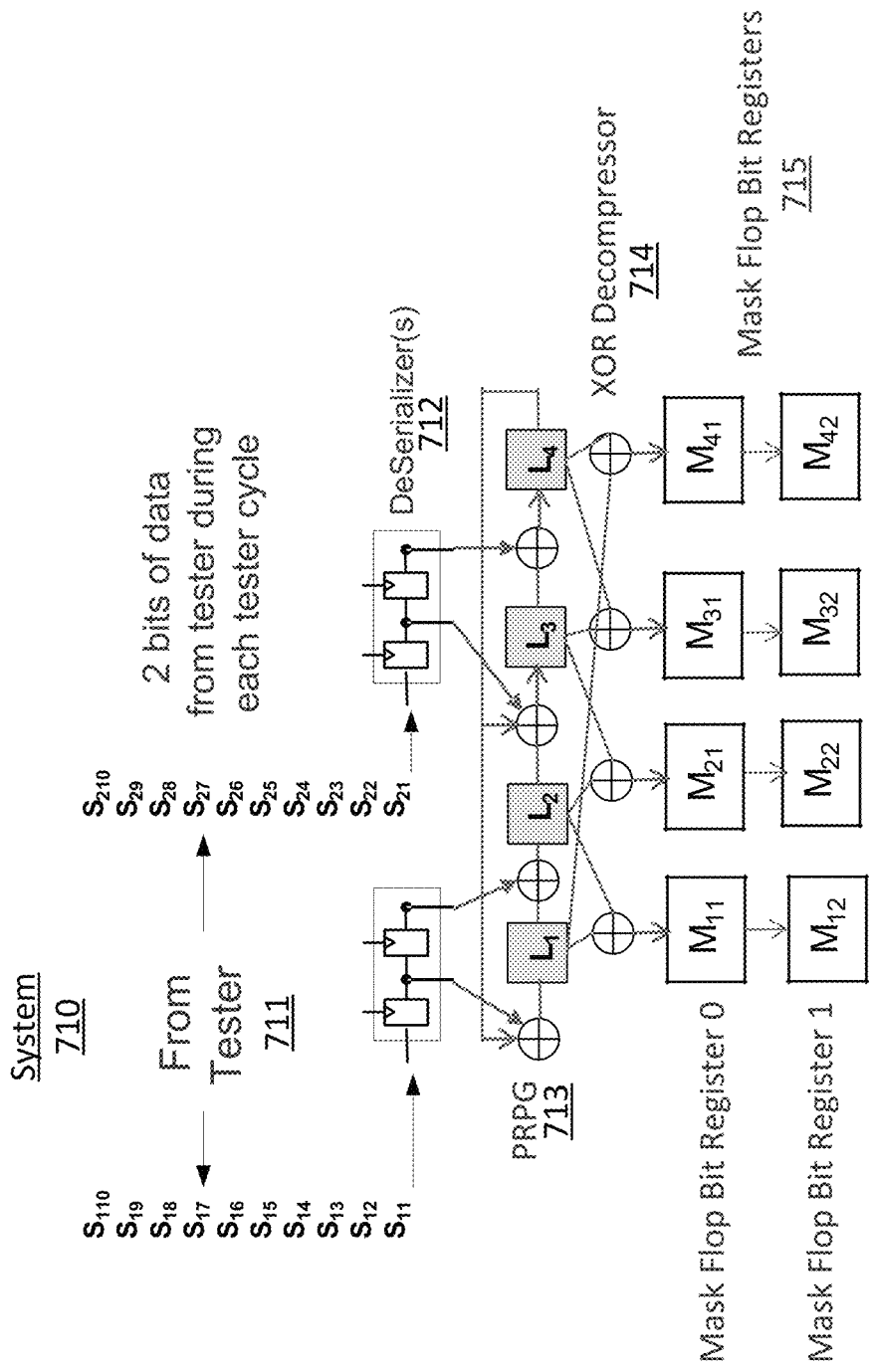
FIG. 7D illustrates a first embodiment of a WIDE2 channel masking system with a 2-bit deserializer utilizing direct loading of the mask register bits from the decompression network outputs.

FIG. 7D illustrates a first embodiment of a WIDE2 channel masking system with a 2-bit deserializer utilizing direct loading of the mask register bits from the decompression network outputs. System 710, which receives input signals 711 from the tester, includes deserializer(s) 712 (e.g., a 2-bit deserializer), a sequential decompressor 713 (e.g., a PRPG), a combinational decompressor 714 (e.g., XOR decompressor), and mask flop bit registers 715 including Mask Flop Bit Register 0 and Mask Flop Bit Register 1. Similar to FIG. 7A, in an embodiment, two bits of data come in from the tester as input signals 711 for each tester cycle. For example, at the first tester cycle, $S_{11}$ and $S_{21}$ come in as input signals 711. In an embodiment, each of signals $S_{11}$ and $S_{21}$ is input into a first shift register of deserializer 712. In the next tester cycle, (i) signals $S_{11}$ and $S_{21}$ are shifted from the first shift register to a second shift register of the deserializer 712 and (ii) new input signals $S_{12}$ and $S_{22}$ are loaded onto the first shift register of the deserializer 712. Accordingly, the outputs of each of the shift registers of the deserializer 712 are fed into different tap points of PRPG 713 and shifted into shift registers of PRPG 713 for each scan cycle. Further, the outputs of the shift registers of the deserializer 712 are XORed with the shifted values of PRPG 713 (including initial state values of the shift registers $L_1$, $L_2$, $L_3$ and $L_4$) for each clock cycle. In an embodiment, the outputs of the shift registers $L_1$, $L_2$, $L_3$ and $L_4$ are fed to an XOR decompressor 714. The output of XOR decompressor 714 is input to the mask flop bit registers 715 at each clock cycle. In an embodiment, the shift registers of PRPG 713 and the mask flop bit registers 715 are updated at each tester cycle. For example, mask data is shifted down into the mask flop bit registers 715 and, then, the PRPG 713 is pulsed with the input variables (i.e., although the scan channels also capture values from the PRPG registers and XOR decompressor during the scan load state of the test protocol, the scan channels are not updated during the mask register load state of the test protocol and, instead, the mask registers are enabled/clocked to update values in the mask registers with values contained in the PRPG registers and the XOR decompressor).

FIG. 7E illustrates the linear equations for the mask register bits after the embedded sequential decompressor of FIG. 7D is primed to a specific value. Similar to FIG. 4B, the final content of the mask flop bit registers 715 will include only the top two slices. FIG. 7F illustrates the state of each bit in the embedded sequential decompressor of FIG. 7D.

Figure 7G:
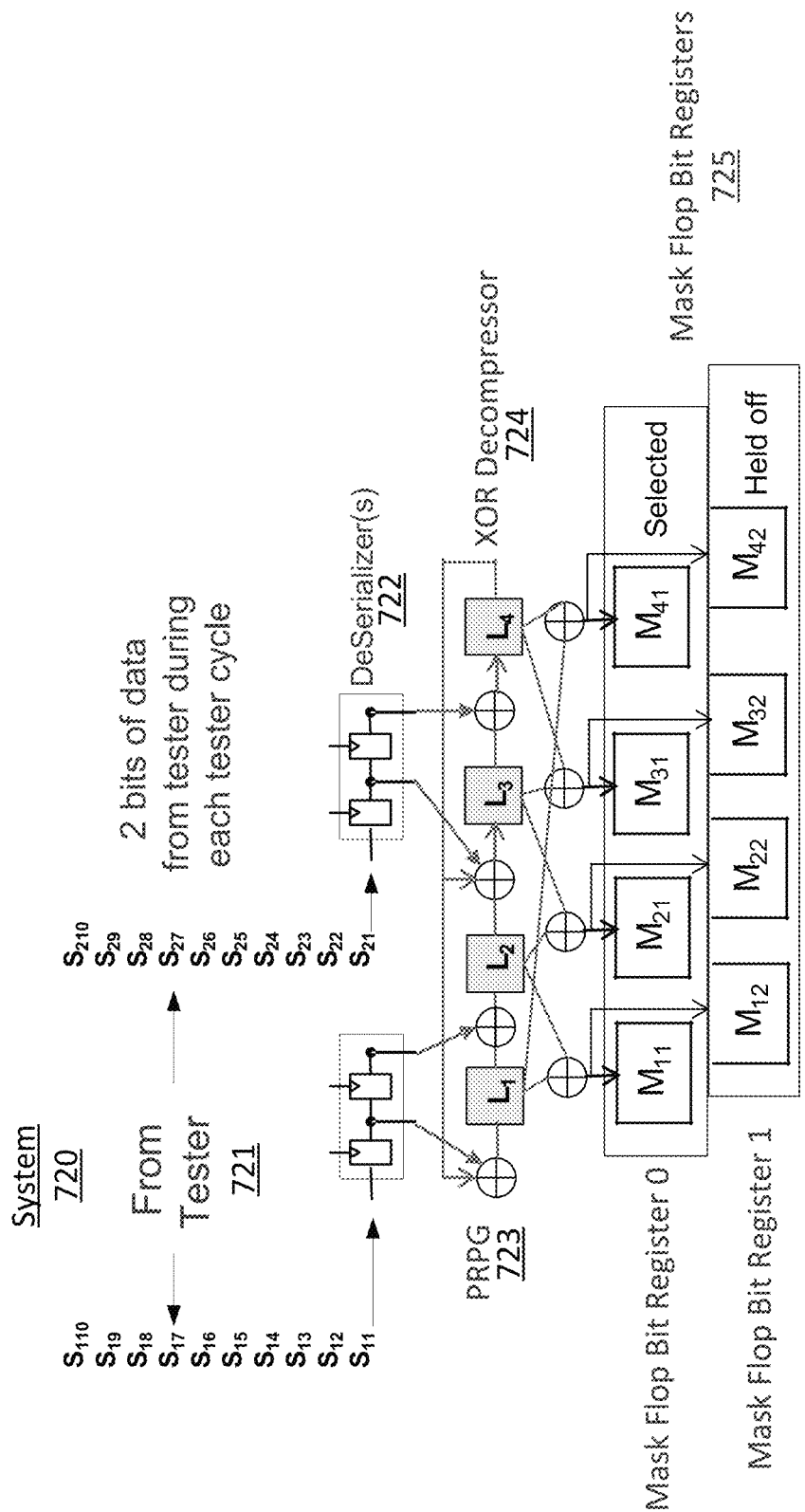
FIG. 7G illustrates a first part of a second embodiment of a WIDE2 channel masking system with a 2-bit deserializer utilizing direct loading of the mask register bits from the decompression network outputs.

FIG. 7G illustrates a first part of a second embodiment of a WIDE2 channel masking system with a 2-bit deserializer utilizing direct loading of the mask register bits from the decompression network outputs. In an embodiment, system 720 is similar to system 710 except that instead of serially loading both Mask Flop Bit Register 0 and Mask Flop Register 1, only Mask Flop Bit Register 0 is loaded with mask data. In an embodiment, Mask Flop Bit Register 0 is loaded with mask data if CME1 is a logical "1" and CME0 is a logical "0."

FIG. 7H illustrates the linear equations for the mask register bits after the embedded sequential decompressor of FIG. 7G is primed to a specific value. Similar to FIG. 5B, the final content of the Mask Flop Bit Register 0 will include only the top slice. FIG. 7I illustrates the state of each bit in the embedded sequential decompressor of FIG. 7G.

Figure 7J:
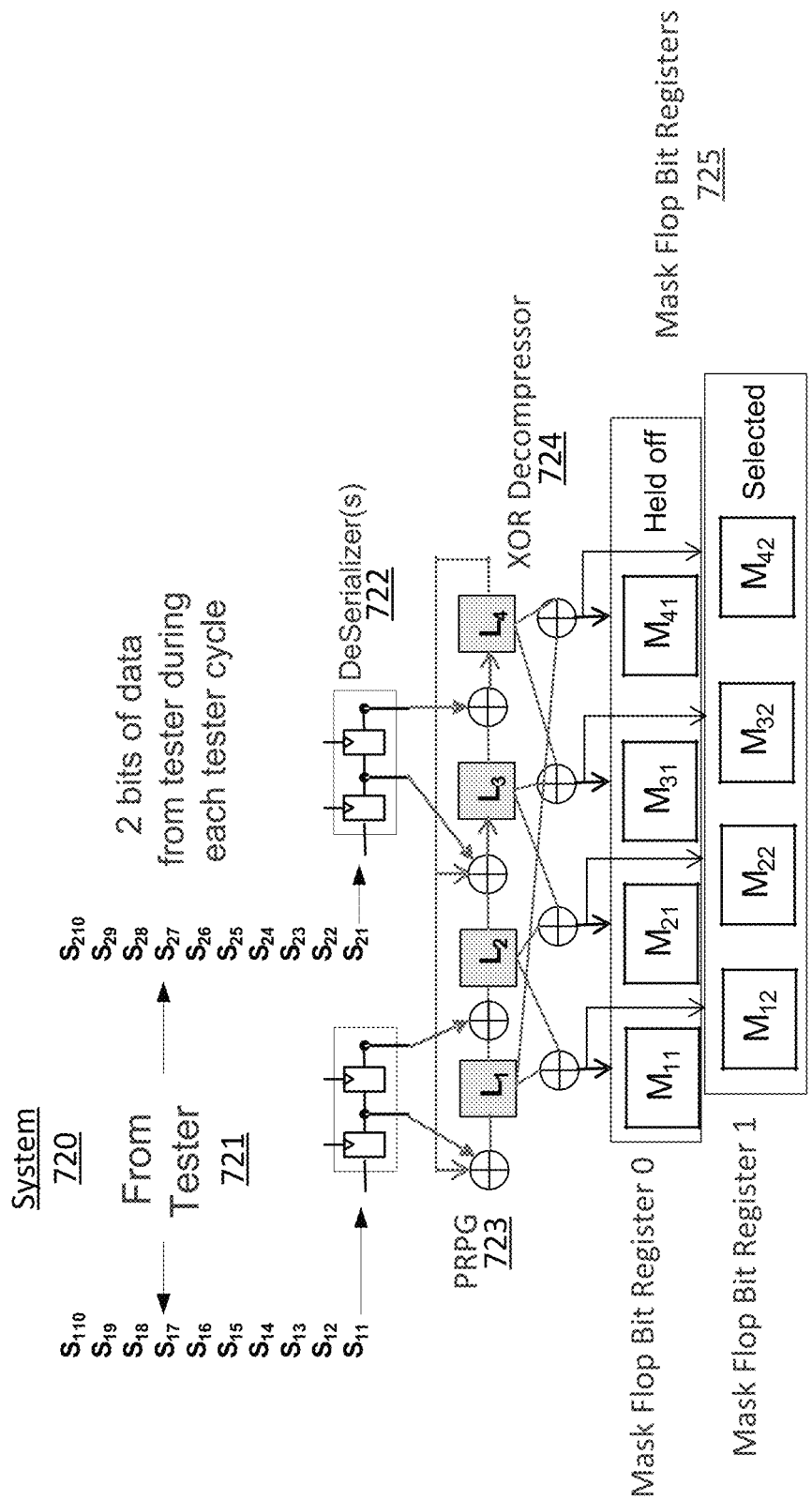
FIG. 7J illustrates a second part of the second embodiment of a WIDE2 channel masking system with a 2-bit deserializer utilizing direct loading of the mask register bits from the decompression network outputs.

FIG. 7J illustrates a second part of the second embodiment of a WIDE2 channel masking system with a 2-bit deserializer utilizing direct loading of the mask register bits from the decompression network outputs. In an embodiment, after Mask Flop Bit Register 0 is loaded with mask data as depicted in FIG. 7G, Mask Flop Bit Register 0 is then held off and, instead, Mask Flop Bit Register 1 is loaded with mask data. In an embodiment, Mask Flop Bit Register 1 is loaded with mask data if CME1 is a logical "0" and CME0 is a logical "1."

FIG. 7K illustrates the linear equations for the mask register bits after the embedded sequential decompressor of FIG. 7J is primed to a specific value. Similar to FIG. 5E, the final content of the Mask Flop Bit Register 1 will include only the top slice. FIG. 7L illustrates the state of each bit in the embedded sequential decompressor of FIG. 7J.

The description of the foregoing embodiments may refer to algorithms, sequences, macros, and operations that require processor execution of instructions stored in memory. The processor may be specific to an apparatus, such as automated test equipment (ATE). The processing device executes, or selectively activates in order to execute, a computer program. The computer program is stored in memory associated with the apparatus. Memory available on the apparatus may include a computer readable storage medium, which is not limited to, but may include, any type of disk, including floppy disks, optical disks, CD-ROMs, magnetic-optical disks, and other memory such as read-only memory (ROMs), random access memory (RAMs), electrically erasable programmable read-only memory (EEPROM), flash memory, and yet other storage such as magnetic or optical cards, or any type of media that stores program instructions. Each of the memory devices implemented in the apparatus is further connected to or coupled to a system bus or a network connection, wired or unwired, capable of facilitating or driving communications.

In the foregoing Description of Embodiments, various features may be grouped together in a single embodiment for purposes of streamlining the disclosure. This method of disclosure is not to be interpreted as reflecting an intention that the claims require more features than are expressly recited in each claim. Rather, as the following claims reflect, inventive aspects lie in less than all features of a single foregoing disclosed embodiment. Thus, the following claims are hereby incorporated into this Description of the Embodiments, with each claim standing on its own as a separate embodiment of the invention.

Moreover, it will be apparent to those skilled in the art from consideration of the specification and practice of the present disclosure that various modifications and variations can be made to the disclosed systems and methods without departing from the scope of the disclosure, as claimed. Thus, it is intended that the specification and examples be considered as exemplary only, with a true scope of the present disclosure being indicated by the following claims and their equivalents.

What is claimed is:

1. A system for loading a mask flop bit register of an automatic test pattern generation system, comprising:
   a sequential decompressor configured to receive m scan inputs;
   a combinational decompressor network configured to receive a plurality of outputs from the sequential decompressor, wherein the mask flop bit register is configured to directly receive a plurality of outputs from the combinational decompressor network.

2. The system of claim 1, further comprising:
   an interface, configured to receive the m scan inputs and provide a plurality of outputs to the sequential decompressor, wherein, in a first state, the interface outputs the m scan inputs, and, in a second state, the interface outputs i×m scan inputs, wherein i is an integer greater than 1.

3. The system of claim 2, further comprising:
   at least one i-bit deserializer of the interface, configured to (i) receive the m scan inputs and (ii) output one of the m scan inputs and the i×m scan inputs based on a control signal.

4. The system of claim 2, further comprising a second combinational decompressor network configured to receive the plurality of outputs from the interface, and to provide a plurality of outputs to the sequential decompressor.

5. The system of claim 1, wherein the mask flop bit register is configured to update bits in the mask flop bit register using the outputs from the combinational decompressor network.

6. The system of claim 1, further comprising:
   a second mask flop bit register.

7. The system of claim 6, wherein (i) the mask flop bit register is configured to update bits in the mask flop bit register using the outputs from the combinational decompressor network and (ii) the second mask flop bit register is configured to receive a plurality of values corresponding to the updated bits from the mask flop bit register and update bits in the second mask flop bit register using the plurality of values from the mask flop bit register.

8. The system of claim 6, wherein, in a first step, the mask flop bit register updates bits in the mask flop bit register using the outputs from the combinational decompressor network and, in a second step, the second mask flop bit register (i) receives a plurality of outputs from the combinational decompressor network and (ii) updates bits in the mask flop bit register using the outputs from the combinational decompressor network.

9. A computer-implemented method of loading a mask flop bit register of an automatic test pattern generation system, the method comprising:
   receiving, at a sequential decompressor, m scan inputs;
   updating, with the m scan inputs, bits in the sequential decompressor;
   feeding a set of outputs from the sequential decompressor to a combinational decompressor network; and
   feeding a set of outputs from the combinational decompressor network directly to the mask flop bit register.

10. The computer-implemented method of claim 9, further comprising:
    receiving, at an interface, the m scan inputs from a tester; and
    outputting, from the interface, one of (i) the m scan inputs and (ii) i×m scan inputs to a plurality of inputs of the sequential decompressor, wherein i is an integer greater than 1.

11. The computer-implemented method of claim 10, further comprising:
    receiving, with at least one i-bit deserializer of the interface, the m scan inputs from the tester; and
    outputting one of the m scan inputs and the i×m scan inputs based on a control signal.

12. The computer-implemented method of claim 10, further comprising:
    receiving, with a second combinational decompressor network, a plurality of outputs from the interface;
    feeding a set of outputs from the second combinational decompressor network to the plurality of inputs of the sequential decompressor; and
    updating, with the set of outputs from the second combinational decompressor network, register bits resident in the sequential decompressor.

13. The computer-implemented method of claim 9, further comprising:
    updating bits in the mask flop bit register using the outputs from the combinational decompressor network.

14. The computer-implemented method of claim 9, further comprising:
    updating bits in the mask flop bit register using the outputs from the combinational decompressor network;
    receiving, with a second mask flop bit register, a plurality of values corresponding to the updated bits in the mask flop bit register; and
    updating, with the second mask flop bit register, bits in the second mask flop bit register using the plurality of values from the mask flop bit register.

15. The computer-implemented method of claim 9, further comprising:
    updating bits in the mask flop bit register using the outputs from the combinational decompressor network;
    receiving, with a second mask flop bit register, a plurality of outputs from the combinational decompressor network, and
    updating, with the second mask flop bit register, bits in the second mask flop bit register using the outputs from the combinational decompressor network.

16. A non-transitory computer readable medium containing program instructions for loading a mask flop bit register of an automatic test pattern generation system, wherein execution of the program instructions by one or more processors of a computer system causes one or more processors to perform the following:
    receive, at a sequential decompressor, m scan inputs;
    update, with the m scan inputs, bits in the sequential decompressor;
    feed a set of outputs from the sequential decompressor to a combinational decompressor network; and
    feed a set of outputs from the combinational decompressor network directly to the mask flop bit register.

17. The non-transitory computer readable medium of claim 16, wherein execution of the program instructions by one or more processors of a computer system further causes one or more processors to perform the following:

receive, at an interface, the m scan inputs from a tester; and output, from the interface, one of (i) the m scan inputs and (ii) i×m scan inputs to a plurality of inputs of the sequential decompressor, wherein i is an integer greater than 1.

18. The non-transitory computer readable medium of claim 16, wherein execution of the program instructions by one or more processors of a computer system further causes one or more processors to perform the following:

update bits in the mask flop bit register using the outputs from the combinational decompressor network.

19. The non-transitory computer readable medium of claim 16, wherein execution of the program instructions by one or more processors of a computer system further causes one or more processors to perform the following:

update bits in the mask flop bit register using the outputs from the combinational decompressor network;

receive, with a second mask flop bit register, a plurality of values corresponding to the updated bits in the mask flop bit register; and update, with the second mask flop bit register, bits in the second mask flop bit register using the plurality of values from the mask flop bit register.

20. The non-transitory computer readable medium of claim 16, wherein execution of the program instructions by one or more processors of a computer system further causes one or more processors to perform the following:

update bits in the mask flop bit register using the outputs from the combinational decompressor network;

receive, with a second mask flop bit register, a plurality of outputs from the combinational decompressor network, and update, with the second mask flop bit register, bits in the second mask flop bit register using the outputs from the combinational decompressor network.

* * * * *